(12) United States Patent
Chen et al.

(10) Patent No.: US 11,955,331 B2
(45) Date of Patent: Apr. 9, 2024

(54) METHOD OF FORMING SILICON NITRIDE FILMS USING MICROWAVE PLASMA

(71) Applicant: APPLIED MATERIALS, INC., Santa Clara, CA (US)

(72) Inventors: Hanhong Chen, Milpitas, CA (US); Kelvin Chan, San Ramon, CA (US); Philip Allan Kraus, San Jose, CA (US); Thai Cheng Chua, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 227 days.

(21) Appl. No.: 15/899,656

(22) Filed: Feb. 20, 2018

(65) Prior Publication Data
US 2019/0259598 A1    Aug. 22, 2019

(51) Int. Cl.
*H01L 21/02* (2006.01)
*C23C 16/00* (2006.01)
(Continued)

(52) U.S. Cl.
CPC .......... *H01L 21/0217* (2013.01); *C23C 16/00* (2013.01); *H01L 21/02208* (2013.01); (Continued)

(58) Field of Classification Search
None
See application file for complete search history.

(56) References Cited

U.S. PATENT DOCUMENTS 9,214,333 B1 *  12/2015  Sims ...................... C23C 16/52
9,245,741 B2     1/2016   Karakawa
(Continued)

FOREIGN PATENT DOCUMENTS

CN      102549727 A     7/2012
CN      103548116 A     1/2014
(Continued)

OTHER PUBLICATIONS

Official Letter from Taiwan Patent Application No. 108105625 mailed Feb. 3, 2023, 5 pgs.
(Continued)

*Primary Examiner* — Kelly M Gambetta
(74) *Attorney, Agent, or Firm* — Schwabe, Williamson & Wyatt, P.C.

(57) ABSTRACT

Embodiments includes methods for forming a silicon nitride film on a substrate in a deposition chamber. In embodiments, the substrate is sequentially exposed to a sequence of processing gases, comprising: a silicon halide precursor that absorbs onto a surface of the substrate to form an absorbed layer of the silicon halide, a first reacting gas that includes $N_2$ and one or both of Ar and He, and a second reacting gas comprising a hydrogen-containing gas and one or more of Ar, He, and $N_2$. In embodiments, the hydrogen-containing gas includes at least one of $H_2$ (molecular hydrogen), $NH_3$ (ammonia), $N_2H_2$ (diazene), $N_2H_4$ (hydrazine), and $HN_3$ (hydrogen azide). Embodiments may include repeating the sequence until a desired thickness of the silicon nitride film is obtained.

18 Claims, 10 Drawing Sheets

(51) Int. Cl.
*H01L 21/677* (2006.01)
*H01L 21/687* (2006.01)

(52) U.S. Cl.
CPC .... *H01L 21/0228* (2013.01); *H01L 21/67703* (2013.01); *H01L 21/68771* (2013.01)

(56) References Cited

U.S. PATENT DOCUMENTS

| 9,297,073 | B2 | 3/2016 | Li et al. |
| 2006/0141782 | A1 | 6/2006 | Hasebe et al. |
| 2012/0220137 | A1 | 8/2012 | Ota et al. |
| 2012/0295428 | A1* | 11/2012 | Melnik ............. H01L 21/02458 257/E21.09 |
| 2015/0194298 | A1* | 7/2015 | Lei .................... C23C 16/45551 438/680 |
| 2015/0255324 | A1 | 9/2015 | Li et al. |
| 2016/0064246 | A1 | 3/2016 | Miura et al. |
| 2016/0079054 | A1* | 3/2016 | Chen ................. H01L 21/0228 438/762 |
| 2016/0233322 | A1 | 8/2016 | Yeh et al. |
| 2017/0053792 | A1 | 2/2017 | Lu et al. |
| 2017/0183777 | A1 | 6/2017 | Ikegawa et al. |

FOREIGN PATENT DOCUMENTS

| CN | 105448701 | A | 3/2016 |
| JP | 2006237532 | A | 9/2006 |
| JP | 2012195564 | A | 10/2012 |
| JP | 2016063232 | A | 4/2016 |
| JP | 2017034067 | A | 2/2017 |
| JP | 2017117941 | A | 6/2017 |
| KR | 1020120098448 | A | 9/2012 |
| KR | 1020160033057 | A | 3/2016 |
| KR | 1020170076568 | A | 7/2017 |
| TW | 201617471 | A | 5/2016 |

OTHER PUBLICATIONS

Official Letter from Taiwan Patent Application No. 108105625 dated Aug. 3, 2022, 11 pgs.
Notice of Reasons for Rejection from Japanese Patent Application No. 2019-027117 dated Jan. 31, 2023, 14 pgs.
Notice of First Office Action from Chinese Patent Application No. 20910126663.0 dated Dec. 26, 2023, 12 pgs.

* cited by examiner

METHOD OF FORMING SILICON NITRIDE FILMS USING MICROWAVE PLASMA

BACKGROUND

1) Field

Embodiments relate to the field of semiconductor manufacturing and, in particular, to systems and methods for forming silicon nitride films with microwave plasmas.

2) Description of Related Art

Silicon nitride films play an important role in the integrated circuit industry. For example, silicon nitride films are used in the manufacture of transistors, as nitride spacers, or in memory components as the charge trapping layer or inter-Poly layer. In order to deposit silicon nitride films with good step coverage over nanoscale, high-aspect ratio structures, a film deposition technique called atomic layer deposition (ALD) is often used. ALD is the deposition of a film by sequentially pulsing two or more precursors separated by an inert purge. This allows the film growth to proceed layer by layer, and is limited by the surface active sites. Film growth in this manner allows for thickness control over complex structures, including re-entrant features.

With increased use of 3D structures, silicon nitride films with better conformality and higher quality (e.g., low wet etch rates, high density, etc.) than conventional silicon nitride films are of interest. Current state of the art processes include low pressure chemical vapor deposition (LPCVD) SiN, plasma enhanced chemical vapor deposition (PECVD) SiN, and plasma enhanced atomic layer deposition (PEALD) SiN. LPCVD is generally performed in a furnace and requires a high thermal budget. Substrate-to-substrate repeatability is also an issue with LPCVD. PECVD is an additional process that may be used, but suffers from non-uniformity with plasma and reacting chemicals in high aspect ratio structures like those used in VNAND and DRAM. PEALD is considered one deposition method with great potential for producing very thin, conformal films with precise control of the thickness possible at the atomic level.

SUMMARY

Embodiments includes methods for forming a silicon nitride film on a substrate in a deposition chamber. In embodiments, the substrate is sequentially exposed to a sequence of processing gases, comprising: a silicon halide precursor that absorbs onto a surface of the substrate to form an absorbed layer of the silicon halide, a first reacting gas that includes $N_2$ and one or both of Ar and He, and a second reacting gas comprising a hydrogen-containing gas and one or more of Ar, He, and $N_2$. In embodiments, the hydrogen-containing gas includes at least one of $H_2$ (molecular hydrogen), $NH_3$ (ammonia), $N_2H_2$ (diazene), $N_2H_4$ (hydrazine), and $HN_3$ (hydrogen azide). Embodiments may include repeating the sequence until a desired thickness of the silicon nitride film is obtained.

Additional embodiments include methods for forming a silicon nitride film on a substrate in a deposition chamber by sequentially exposing the substrate to a sequence of processing gases that include, a first silicon halide precursor that absorbs onto a surface of the substrate to form an absorbed layer of the silicon halide; a first reacting gas comprising $N_2$ and a hydrogen-containing gas and one or both of Ar and He. The hydrogen-containing gas may include at least one of, $H_2$ (molecular hydrogen), $NH_3$ (ammonia), $N_2H_2$ (diazene), $N_2H_4$ (hydrazine), and $HN_3$ (hydrogen azide). In an embodiment, the first reacting gas is activated using a plasma source. A second silicon halide precursor may be exposed to the substrate. The second silicon halide absorbs onto a growth surface of the substrate to form an absorbed layer of the silicon halide. Embodiments may then include a second reacting gas that includes $N_2$ and one or both of Ar and He. In an embodiment, the second reacting gas is activated using a plasma source. Embodiments may then include repeating the exposure sequence until a desired thickness of the silicon nitride film is obtained.

DETAILED DESCRIPTION

Systems and methods for depositing high quality SiN films are described in accordance with various embodiments. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

Currently, PEALD plasma chambers utilize RF plasma (e.g. 13.56 MHz) and VHF plasma (e.g. 60 MHz) sources for the reacting gases. However, such plasma sources do not allow for the production of high quality SiN films. Accordingly, embodiments described herein utilize microwave plasma sources (e.g. 2.45 GHz) for the reacting gas. Microwave plasma sources allow for the formation of high quality SiN films because microwave plasma sources provide stronger molecule excitation capability and lower plasma sheath potential. For example, the radical concentration in microwave plasma is typically one to two orders greater than RF or VHF plasma sources. Additionally, the ions in microwave plasmas have lower energy. Embodiments also include reacting gas species and exposure sequence that have been optimized to deposit high quality SiN films.

The combination of a microwave plasma enhanced chemical reaction and the exposure sequence of the reacting gases used in accordance with embodiments described herein provide significant advantages over the currently used SiN processing. For example, the SiN films deposited at low temperatures (e.g., below 450° C.) in accordance with methods described herein exhibit a lower wet etch rate in HF solution due to a higher radical concentration from a microwave plasma. The SiN films also exhibit better film non-uniformity since there are smaller electrical potentials between the plasma source and the susceptor. The gas chemistries also provide increased growth per cycle (GPC). As such, throughput is increased. The SiN films also have better conformality and step coverage for trench filling. The improvement is made due to the different gas chemistry, the increase in radical concentration, and less ion bombardment. The lower ion energy and lower plasma sheath potential also results in less damage to the substrates and less metal contamination during processing. Additionally, the improved gas chemistry allows for lower substrate processing temperatures.

Figure 1A:
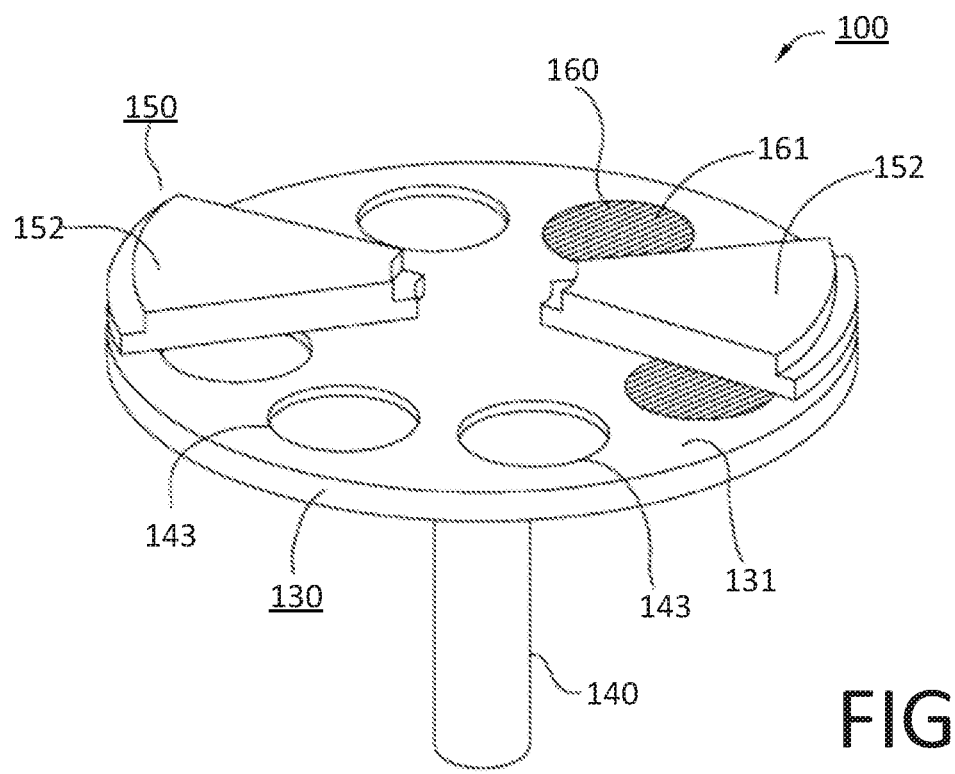
FIG. 1A is a perspective view of a susceptor and a portion of a plasma/gas assembly that may be used to deposit SiN films on substrates, in accordance with an embodiment.

SiN deposition processes described herein may be implemented in a microwave plasma chamber that includes two or more gas injectors positioned over a susceptor. FIG. 1A is a partial perspective view illustration of batch processing chamber 100 according to an embodiment. FIG. 1A provides an illustration of a susceptor assembly 130 and a gas/plasma assembly 150. The chamber and other components are omitted for clarity. The susceptor assembly 130 has a top surface 131 and a plurality of recesses 143 formed into the top surface 131. Each recess 143 may support one substrate 160. In an embodiment, the susceptor assembly 130 may include six recesses 143 for supporting six substrates 160, though embodiments may include any number of recesses 143. In an embodiment, the recesses 143 may be sized so that the substrate 160 supported in the recess 143 has a top surface 161 that is substantially coplanar with the top surface 131 of the susceptor assembly 130. The susceptor assembly 130 may be rotated by a support shaft 140 during or between the deposition processes described herein.

The gas/plasma distribution assembly 150 may include a plurality of pie-shaped segments 152. Portions of the gas/plasma distribution assembly 150 are removed to illustrate the susceptor assembly 130 positioned below the gas/plasma distribution assembly 150. In some embodiments, the plurality of segments 152 may alternatively be formed in one piece that has substantially the same shape as the susceptor assembly 130. A portion of the gas/plasma distribution assembly 150 is illustrated in FIG. 1B.

Figure 1B:
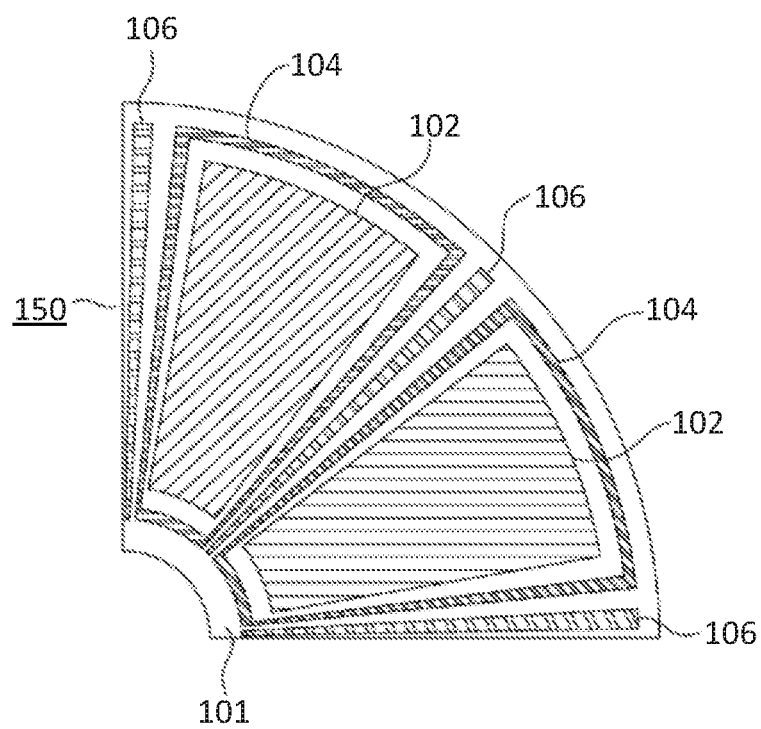
FIG. 1B is a plan view of a two injectors in a plasma/gas assembly that may be used to deposit SiN films on substrates, in accordance with an embodiment.

Referring now to FIG. 1B, a schematic bottom view of a portion of the gas/plasma distribution assembly 150 is shown, according to an embodiment. The gas/plasma distribution assembly 150 has a surface 101 facing the susceptor assembly 130. A plurality of gas/plasma ports 102 may be formed in the surface 101. Surrounding each gas/plasma port 102 is a purge gas port 104 and between adjacent gas/plasma ports 102 is a vacuum port 106. The gas/plasma ports 102 may provide gasses and/or plasma into the chamber via gas/plasma injectors (not shown) and the purge gas port 104 may provide a purge gas into the chamber via a gas injector (not shown), as is known in the art. In an embodiment, there may be eight gas/plasma ports 102 disposed in the surface 101. In one embodiment, there are eight segments 152 forming the gas/plasma distribution assembly 150, each having one gas/plasma port 102. The portion of the gas/plasma assembly 150 shown in FIG. 1B may be the combination of two segments 152. While eight gas/plasma ports 102 are described for use in the SiN deposition processes described herein, it is to be appreciated that any number of gas/plasma ports may be used in a given processing chamber.

In accordance with embodiments described herein, plasma ports 102 refer plasma ports that introduce a microwave plasma into the chamber. For example, microwave plasmas may have a frequency of approximately 2.45 GHz. Embodiments also include microwave plasmas that are formed by delivering a power for each injector that is equal to or greater than 500 W for a 300 mm wafer. In an embodiment, the a single microwave plasma injector (not shown) or a plurality of modular microwave plasma injectors (not shown) may be used to introduce the microwave plasma through each plasma port 102.

Figure 2A:
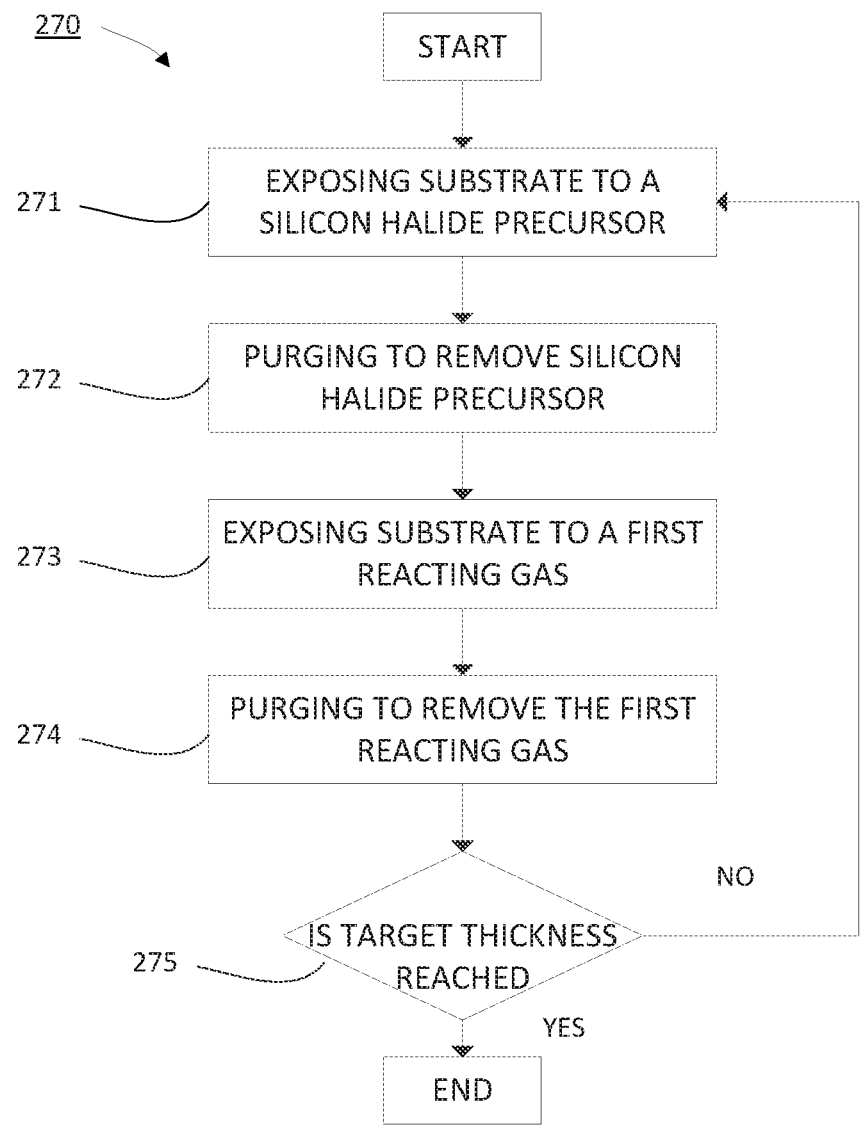
FIG. 2A is a process flow diagram of a first SiN deposition process that uses an AB ALD sequence, in accordance with an embodiment.

Referring now to FIG. 2A, a process flow diagram illustrating an ALD process 270 for forming a SiN film is shown, according to an embodiment. Process 270 describes a process that may be referred to as an "AB" process. An AB process is a process that includes sequentially exposing a substrate to two different processing gasses. Particularly, process 270 includes an "A" injector that introduces a silicon halide precursor into the chamber through a gas/plasma port 102 and a "B" injector that introduces a first reacting gas into the chamber through a gas/plasma port 102. A schematic of the AB injector layout is illustrated in FIG. 2B.

Figure 2B:
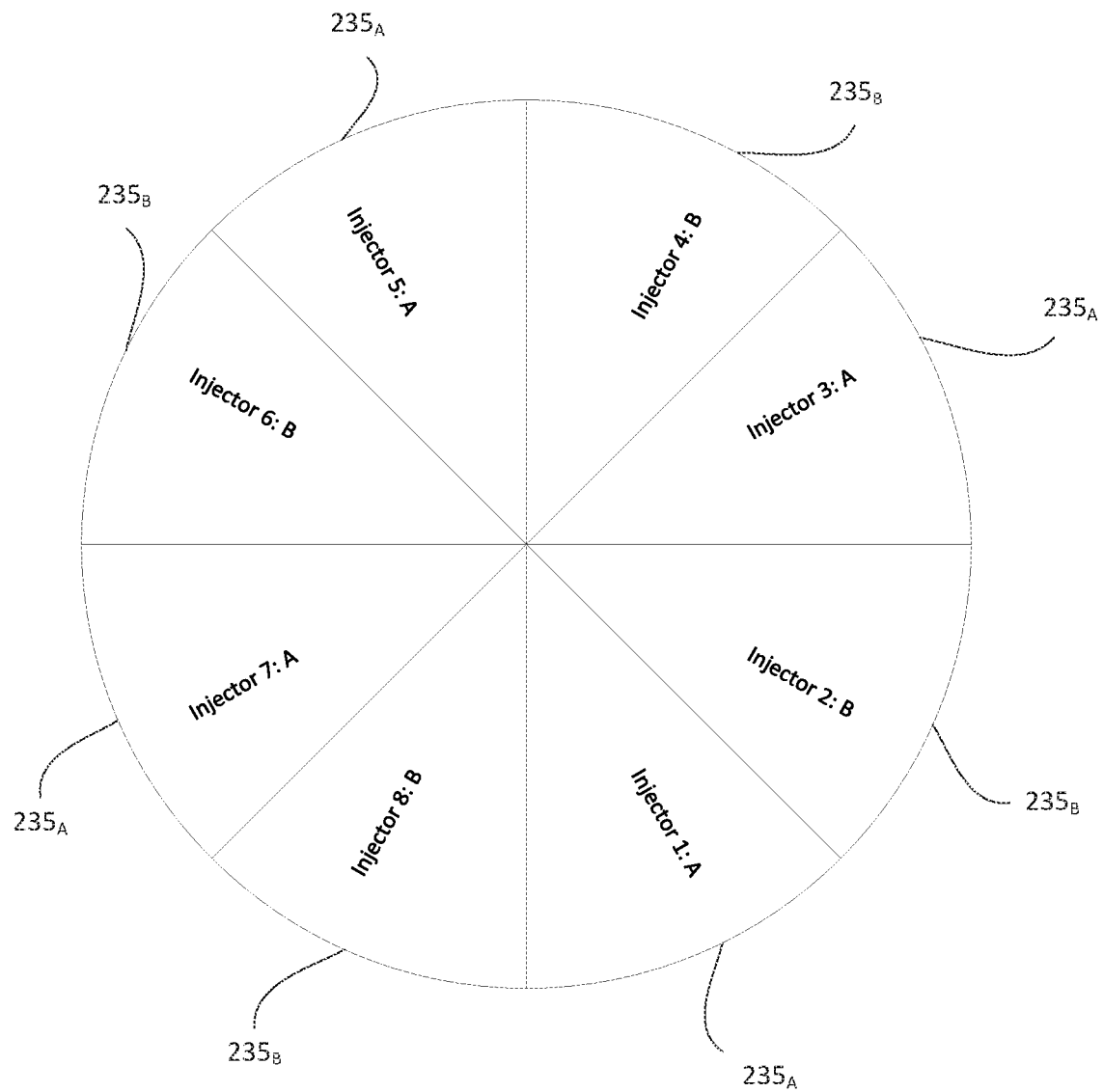
FIG. 2B is a schematic of the injectors used in the first SiN deposition process, in accordance with an embodiment.

Referring now to FIG. 2B, the odd numbered injectors 235 (i.e., injectors 1, 3, 5, and 7) are the "A" injectors $235_A$ (i.e., the silicon halide precursor) and the even numbered injectors 235 (i.e., injectors 2, 4, 6, and 8) are the "B" injectors $235_B$ (i.e., the first reacting gas). Each injector may correspond to a gas/plasma port 102, similar to those described above with respect to FIG. 1B. For example, each of the injectors 235 may be formed on different segments 152 of a gas/plasma distribution assembly 150 or each injector 235 may be formed on a single gas/plasma distribution assembly 150 that includes a plurality of injectors 235.

According to an embodiment where eight injectors 235 are used, each time a substrate makes a complete revolution around the chamber (i.e., the substrate passes below all eight injectors 235), the substrate is exposed to four AB ALD cycles. Additional embodiments may include any number of injectors 235, and therefore, may allow for any number of ALD cycles per revolution. Additionally, not all injectors 235 may be used for either an A or B portion of the ALD cycle. For example, an injector 235 that introduces a purge gas into the chamber may be positioned between an A injector $235_A$ and a B injector $235_B$.

Referring back to ALD process 270 in FIG. 2A, the process may start with operation 271 that includes exposing a substrate to a silicon halide precursor. In an embodiment, the substrate may be initially located under any of the "A" injectors 235. Embodiments include silicon halide precursors with a chemical makeup of $SiH_yX_{(4-y)}$, where X can be one of Cl, Br, and I. In a particular embodiment, the silicon halide precursor may be $SiH_xCl_{4-x}$, where x can be 0, 1, 2, 3, or 4. For example, the silicon halide precursor may be $SiH_2Cl_2$. In an embodiment, the silicon halide precursor may interact with the surface of the substrate 160 to provide a surface that is silicon rich and able to favorably react with subsequent reacting gasses in the ALD cycle to form a SiN film.

After operation 271, ALD process 270 continues on to operation 272 that includes purging to remove the silicon halide precursor. In an embodiment, the purging may be implemented by supplying an inert purging gas (e.g., $N_2$, Ar, He, etc.) through a purging port 104 and evacuating gases with a vacuum port 106. Operation 272 may be implemented as the substrate 160 is transferred to a subsequent "B" injector $235_B$. For example, a substrate 160 on a rotating susceptor assembly 130 that is positioned below injector 1 may be transferred to be below injector 2.

After operation 272, ALD process 270 continues on to operation 273 that includes exposing the substrate 160 to a first reacting gas. The substrate may be exposed to the first reacting gas while positioned below a "B" injector $235_B$. The first reacting gas reacts with the surface of the substrate 160 that has been previously exposed to the silicon halide precursor to produce a SiN film. In an embodiment, the first reacting gas comprises $N_2$, a hydrogen-containing gas, and one or both of Ar and He. The hydrogen-containing gas includes at least one of the following gas, $H_2$ (molecular hydrogen), $NH_3$ (ammonia), $N_2H_2$ (diazene), $N_2H_4$ (hydrazine), and $HN_3$ (hydrogen azide). In an embodiment, the first reacting gas is activated using a microwave plasma. Embodiments include a microwave plasma at a frequency of approximately 2.45 GHz. In an embodiment, the plasma power delivered to the first reacting gas is 500 W or greater for a 300 mm wafer.

Each of the constituents of the first reacting gas may provide different beneficial properties to the SiN film. For example, Ar and He increase the plasma density and increase the plasma substrate coverage. This provides improvement in the non-uniformity of the film. $N_2$ dissociates into N* radicals in a microwave plasma. The N* radicals aid in the removal of H from the SiN film and help improve the density of the SiN film. Removal of H and increased density result in a lower wet etch rate of the SiN film in diluted HF solution. The hydrogen-containing gas in the microwave dissociates into H* radicals and $NH^*/NH_2^*$ radicals. The H* radicals aid in the removal of Cl in the reaction. The H* radicals in the microwave plasma also react with N* radicals to form $NH^*/NH_2^*$ radicals. $NH^*/NH_2^*$ radicals absorb on the substrate surface and provide absorbing sites where the silicon halide precursor sticks and reacts in a subsequent ALD cycle. Accordingly, the presence of hydrogen-containing gas in microwave plasma results in improved growth per cycle (GPC) and improved throughput. In the AB process, the relative concentration of N* radicals and $NH^*/NH_2^*$ radicals is critical for the quality of the SiN film. To achieve SiN films with a high film density and a low wet etch rate, a microwave plasma with a high concentration of N* radicals and a low concentration of $NH^*/NH_2^*$ radicals is required. The control of the relative concentration of N* radicals and $NH^*/NH_2^*$ radicals is achieved by controlling the gas composition in the microwave plasma. In a particular embodiment, the flow rate of the hydrogen-containing gas is 2% or less of the total flow rate of the first reacting gas. The flow rate of $N_2$ is 2% or greater of the total flow rate of the first reacting gas. In an ideal case, the flow rate of $N_2$ is 5 times higher than the flow rate of the hydrogen-containing gas. For example, SiN films formed in accordance with embodiments of process 270 have a refractive index of 1.95, and a wet etch rate of 10 Å/min in 100:1 diluted HF solution at a substrate temperature of 350° C.

After operation 273, ALD process 270 continues to operation 274 that includes purging to remove the first reacting gas. In an embodiment, the purging may be implemented by supplying an inert purging gas (e.g., $N_2$, Ar, He, etc.) through a purging port 104 and evacuating gases with a vacuum port 106. Operation 274 may be implemented as the substrate 160 is transferred to a subsequent "A" injector $235_A$. For example, a substrate 160 on a rotating susceptor assembly 130 that is positioned below injector 2 may be transferred to be below injector 3.

After operation 274, ALD process 270 continues to operation 275 that includes determining if a target thickness of the SiN film has been reached. When the target thickness has been reached, the process 270 may be ended. When the target thickness has not been reached process 270 may be repeated for another AB cycle (e.g., processing operations 271-275). In an embodiment, subsequent AB cycles may include the same processing conditions (e.g., temperatures, gas flow rates, etc.). In additional embodiments, subsequent AB cycles may include different processing conditions. For example, the flow rates of the constituent gasses in the first reacting gas may be varied in each AB cycle.

It is to be appreciated that in some embodiments the substrate 160 is continually rotated on the susceptor assembly 130. As such, some embodiments may include a substrate 160 that is exposed to the A process and the B process at the same time. Additionally, it is to be appreciated that embodiments may also include a susceptor assembly 130 that allows for the temperature of the substrate 160 to be controlled. In accordance with various embodiments, the temperature of the substrate may be less than 800° C., less than 400° C., or less than 250° C. The pressure in the processing chamber may also be controlled in order to provide desired film characteristics and/or GPC. Embodiments include processing pressures that are 20 Torr or less, 10 Torr or less, 5 Torr or less, or 3 Torr or less.

Figure 3A:
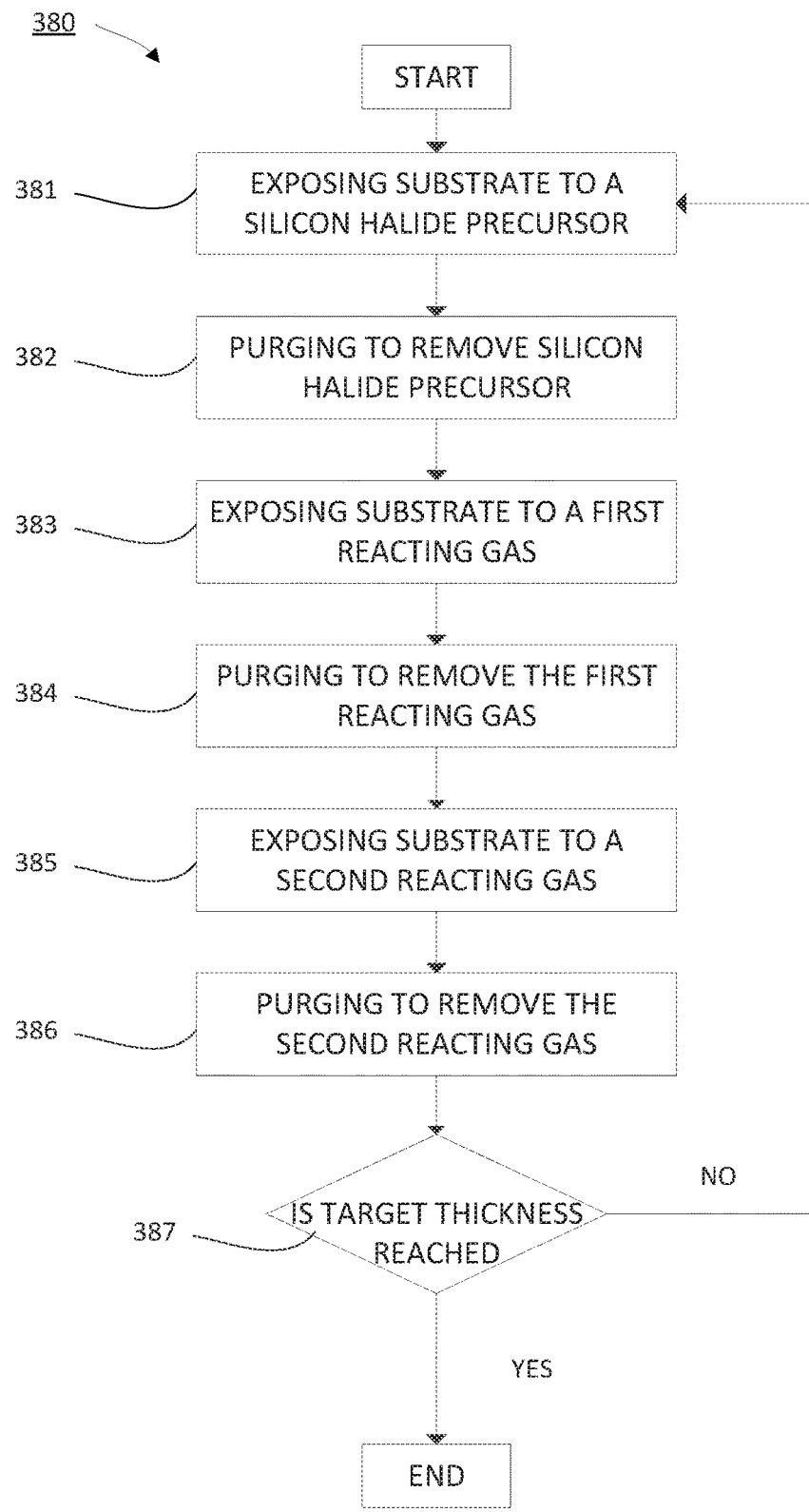
FIG. 3A is a process flow diagram of a second SiN deposition process that uses an ABC ALD sequence, in accordance with an embodiment.

Referring now to FIG. 3A, a process flow diagram illustrating an ALD process 380 for forming a SiN film is shown, according to an embodiment. Process 380 describes a process that may be referred to as an "ABC" process. An ABC process is a process that includes sequentially exposing a substrate to three different processing gasses. Particularly, process 370 includes an "A" injector that introduces a silicon halide precursor into the chamber through a gas/plasma port 102, a "B" injector that introduces a first reacting gas into the chamber through a gas/plasma port 102, and a "C" injector that introduces a second reacting gas into the chamber through a gas/plasma port 102. A schematic of the ABC injector layout is illustrated in FIG. 3B.

Figure 3B:
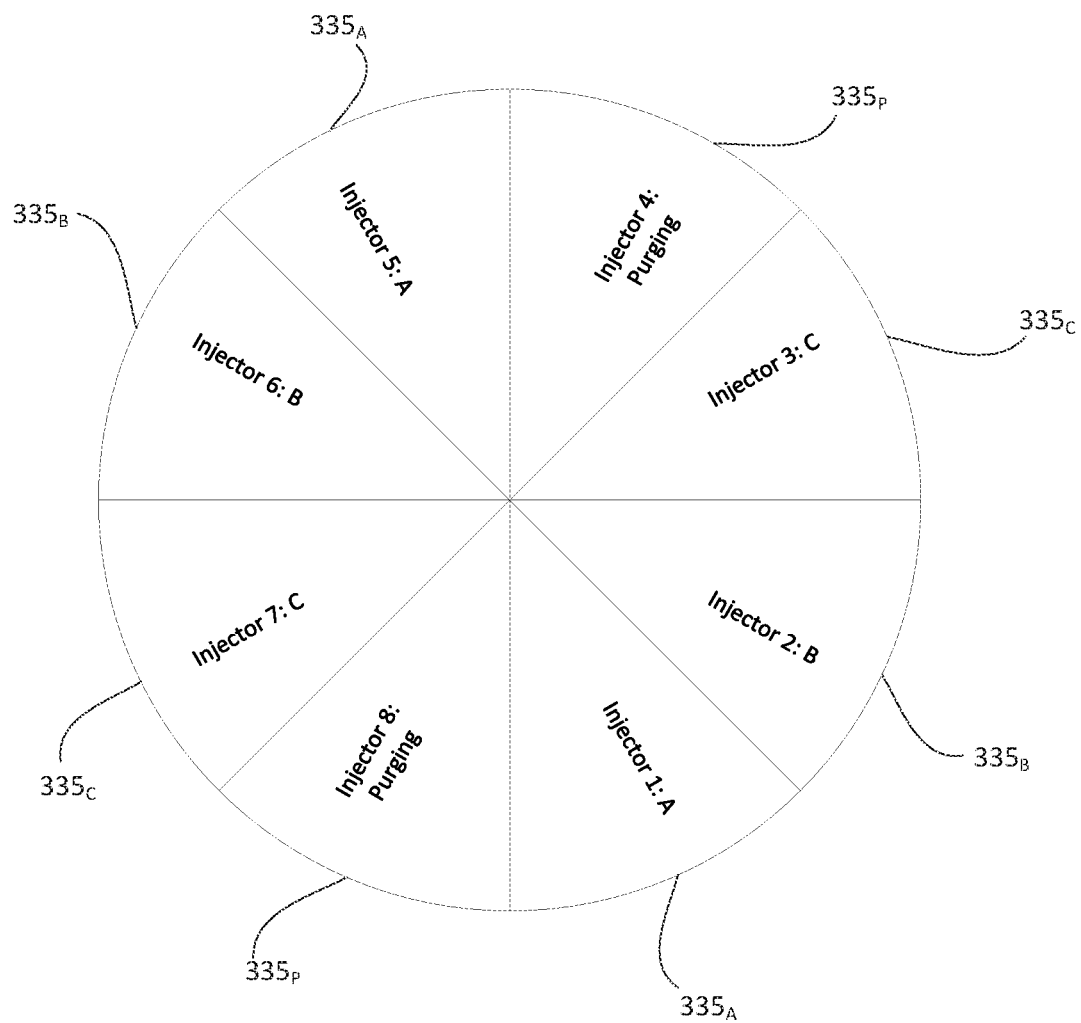
FIG. 3B is a schematic of the injectors used in the second SiN deposition process, in accordance with an embodiment.

Referring now to FIG. 3B, two injectors 335 (i.e., injectors 1 and 5) are the "A" injectors $335_A$ (i.e., the silicon halide precursor), two of the injectors 335 (i.e., injectors 2 and 6) are the "B" injectors $335_B$ (i.e., the first reacting gas), and two of the injectors 335 (i.e., injectors 3 and 7) are the "C" injectors $335_C$ (i.e., the second reacting gas). In the illustrated embodiment, two additional injectors 335 (injectors 4 and 8) are purge gas injectors $335_P$. Each injector may correspond to a gas/plasma port 102, similar to those described above with respect to FIG. 1B. For example, each of the injectors 335 may be formed on different segments 152 of a gas/plasma distribution assembly 150 or each injector 335 may be formed on a single gas/plasma distribution assembly 150 that includes a plurality of injectors 335. Additionally, it is to be appreciated that the locations of the purging gas injectors $335_P$ may be anywhere among the A, B, and C injectors 335. For example, the purging gas injectors $335_P$ may be between the B injector $335_B$ and the C injector $335_C$.

Additionally, the purging gas injectors $335_P$ may be omitted if the chamber only includes six injectors 335. Particularly, embodiments may include a chamber that includes three injectors 335 (to accommodate the ABC process) or any multiple of three injectors 335 (e.g., three, six, nine, etc.) to accommodate multiple cycles of the ABC process in a single revolution. In embodiments that utilize an ABC process with a purging gas injector $335_P$, the chamber may include four injectors 335 (to accommodate the ABC and purge process) or any multiple of four injectors 335 (e.g., four, eight, twelve, etc.) to accommodate multiple cycles of the ABC process with a purging gas injector $335_P$ in a single revolution. According to an embodiment where eight injectors 335 are used, each time a substrate makes a complete revolution around the chamber (i.e., the substrate passes below all eight injectors 335), the substrate is exposed to two ABC ALD cycles. Additional embodiments may include any number of injectors 335, and therefore, may allow for any number of ABC ALD cycles per revolution.

Referring back to ALD process 380 in FIG. 3A, the process may start with operation 381 that includes exposing a substrate to a silicon halide precursor. In an embodiment, the substrate may be initially located under any of the "A" injectors $335_A$. Embodiments include silicon halide precursors with a chemical makeup of $SiH_yX_{(4-y)}$, where X can be one of Cl, Br, and I. In a particular embodiment, the silicon halide precursor may be $SiH_xCl_{4-x}$, where x can be 0, 1, 2, 3, or 4. For example, the silicon halide precursor is $SiH_2Cl_2$. In an embodiment, the silicon halide precursor may interact with the surface of the substrate 160 to provide a surface that is silicon rich and able to favorably react with subsequent reacting gasses in the ALD cycle to form a SiN film.

After operation 381, ALD process 380 continues on to operation 382 that includes purging to remove the silicon halide precursor. In an embodiment, the purging may be implemented by supplying an inert purging gas (e.g., $N_2$, Ar, He, etc.) through a purging port 104 and evacuating gases with a vacuum port 106. Operation 382 may be implemented as the substrate 160 is transferred to a subsequent "B" injector $335_B$. For example, a substrate 160 on a rotating susceptor assembly 130 that is positioned below injector 1 may be transferred to be below injector 2.

After operation 382, ALD process 380 continues on to operation 383 that includes exposing the substrate 160 to a first reacting gas. The substrate may be exposed to the first reacting gas while positioned below a "B" injector $335_B$. The first reacting gas reacts with the surface of the substrate 160 that has been previously exposed to the silicon halide precursor to produce a SiN film. In an embodiment, the first reacting gas comprises a hydrogen-containing gas and one or more of Ar, He, and $N_2$. The hydrogen-containing gas includes at least one of the following gas, $H_2$ (molecular hydrogen), $NH_3$ (ammonia), $N_2H_2$ (diazene), $N_2H_4$ (hydrazine), and $HN_3$ (hydrogen azide).

In an embodiment, the first reacting gas may be activated using a microwave plasma. Embodiments include a microwave plasma at a frequency of approximately 2.45 GHz. In an embodiment, the plasma power delivered to the first reacting gas is 500 W or greater for a 300 mm wafer. In additional embodiment, the first reacting gas may not be activated by plasma. In such embodiments, the interaction of the first reacting gas with the surface of the substrate 160 may be driven by a thermal process. The use of a thermal only first reacting gas may provide a lower GPC. In a particular embodiment when a thermal process is used for operation 382, the first reacting gas may comprise $NH_3$.

Each of the constituents of the first reacting gas may provide different beneficial properties to the SiN film. For example, Ar and He increase the plasma density and increase the plasma substrate coverage. This provides improvement in the non-uniformity of the film. $N_2$ dissociates into N* radicals in a microwave plasma. The N* radicals aid in the removal of H from the SiN film and help improve the density of the SiN film. Removal of H and increased density result in a lower wet etch rate of the SiN film in diluted HF solution. The hydrogen-containing gas in the microwave dissociates into H* radicals and $NH^*/NH_2^*$ radicals. The H* radicals aid in the removal of Cl in the reaction. The H* radicals in the microwave plasma also react with N* radicals to form $NH^*/NH_2^*$ radicals. $NH^*/NH_2^*$ radicals absorb on the substrate surface and provide absorbing sites where the silicon halide precursor reacts in a subsequent ALD cycle. In the ABC process, a high gas flow rate of a hydrogen-containing gas is desired to improve GPC and the flow rate of the hydrogen-containing gas is 5% or greater of the total gas flow rate.

After operation 383, ALD process 380 continues to operation 384 that includes purging to remove the first reacting gas. In an embodiment, the purging may be implemented by supplying an inert purging gas (e.g., $N_2$, Ar, He, etc.) through a purging port 104 and evacuating gases with a vacuum port 106. Operation 384 may be implemented as the substrate 160 is transferred to a subsequent "C" injector $335_C$. For example, a substrate 160 on a rotating susceptor assembly 130 that is positioned below injector 2 may be transferred to be below injector 3.

After operation 384, ALD process 380 continues to operation 385 that includes exposing the substrate to a second reacting gas. The substrate may be exposed to the second reacting gas while positioned below a "C" injector $335_C$. The second reacting gas reacts with the surface of the substrate 160 that has been previously exposed to the first reacting gas. In an embodiment, the second reacting gas comprises $N_2$ and one or both of Ar and He. According to an embodiment, $N_2$ may account for 2% or greater of the total flow of the second reacting gas. In an embodiment, the second reacting gas may be activated using a microwave plasma. Embodiments include a microwave plasma at a frequency of approximately 2.45 GHz. In an embodiment, the plasma power delivered to the first reacting gas is 500 W or greater for a 300 mm wafer. $N_2$ in a microwave plasma dissociates into N* radicals. N* radicals strip H from the film and improve the film density. SiN films formed in accordance with processes 380 described above are high quality SiN films. For example, SiN films formed in accordance with embodiments of process 380 have a refractive indexes of 1.96, and a wet etch rate of 6 A/min in 100:1 diluted HF solution at a substrate temperature of 350° C.

After operation 385, ALD process 380 continues to operation 386 that includes purging to remove the second reacting gas. In an embodiment, the purging may be implemented by supplying an inert purging gas (e.g., $N_2$, Ar, He, etc.) through a purging port 104 and evacuating gases with a vacuum port 106. Operation 386 may be implemented as the substrate 160 is transferred to a subsequent "purging" injector $335_P$. For example, a substrate 160 on a rotating susceptor assembly 130 that is positioned below injector 3 may be transferred to be below injector 4.

In one embodiment, the gas composition in the first reacting gas and the second reacting gas is switched. For example, the first reacting gas comprises $N_2$ and one or both of Ar and He. According to an embodiment, $N_2$ may account for 2% or more of the total flow rate of the first reacting gas. The first reacting gas may be activated using a microwave plasma. The second reacting gas comprises a hydrogen-containing gas and one or more of Ar, He, and Na. The hydrogen-containing gas includes at least one of the following gases, $H_2$ (molecular hydrogen), $NH_3$ (ammonia), $N_2H_2$ (diazene), $N_2H_4$ (hydrazine), and $HN_3$ (hydrogen azide). The flow rate of the hydrogen-containing gas is 5% or greater of the total gas flow rate. The sequence of the substrate exposing to the first and second reacting gases is important to improve the GPC and throughput. An ABC process having first reacting gas comprising $N_2$ and the second reacting gas comprising a hydrogen-containing gas, has a GPC about 40% higher than an ABC process having the first reacting gas comprising $N_2$ and the second reacting gas comprising a hydrogen-containing gas.

After operation 386, ALD process 380 continues to operation 387 that includes determining if a target thickness of the SiN film has been reached. When the target thickness has been reached, the process 380 may be ended. When the target thickness has not been reached process 380 may be repeated for another ABC cycle (e.g., processing operations 381-386). In an embodiment, subsequent ABC cycles may include the same processing conditions (e.g., temperatures, gas flow rates, etc). In additional embodiments, subsequent ABC cycles may include different processing conditions. For example, the flow rates of the constituent gasses in the first reacting gas may be varied in each ABC cycle. In additional embodiments, the ABC cycle may alternate between activating the first reacting gas with plasma and not activating the first reacting gas.

It is to be appreciated that in some embodiments the substrate 160 is continually rotated on the susceptor assembly 130. As such, some embodiments may include a substrate 160 that is exposed to the A process and the B process at the same time, and exposed to the B process and the C process at the same time. Additionally, it is to be appreciated that embodiments may also include a susceptor assembly 130 that allows for the temperature of the substrate 160 to be controlled. In accordance with various embodiments, the temperature of the substrate may be less than 800° C., less than 400° C., or less than 250° C. The pressure in the processing chamber may also be controlled in order to provide desired film characteristics and/or GPC. Embodiments include processing pressures that are 20 Torr or less, 10 Torr or less, 5 Torr or less, or 3 Torr or less.

According to an embodiment, injector 4 may be a dedicated purging injector $335_P$. Instead of supplying a processing gas (i.e., silicon halide precursor, first reacting gas, or second reacting gas), the purging injector $335_P$ may provide a segment dedicated to purging. In the illustrated embodiment, the purging injector $335_P$ is located at injector 4. However, embodiments include purging injectors $335_P$ that are located at any position (e.g., between "A" injector $335_A$ and "B" injector $335_B$, between "B" injector $335_B$ and "C" injector $335_C$, or between "C" injector $335_C$ and "A" injector $335_A$).

Figure 4A:
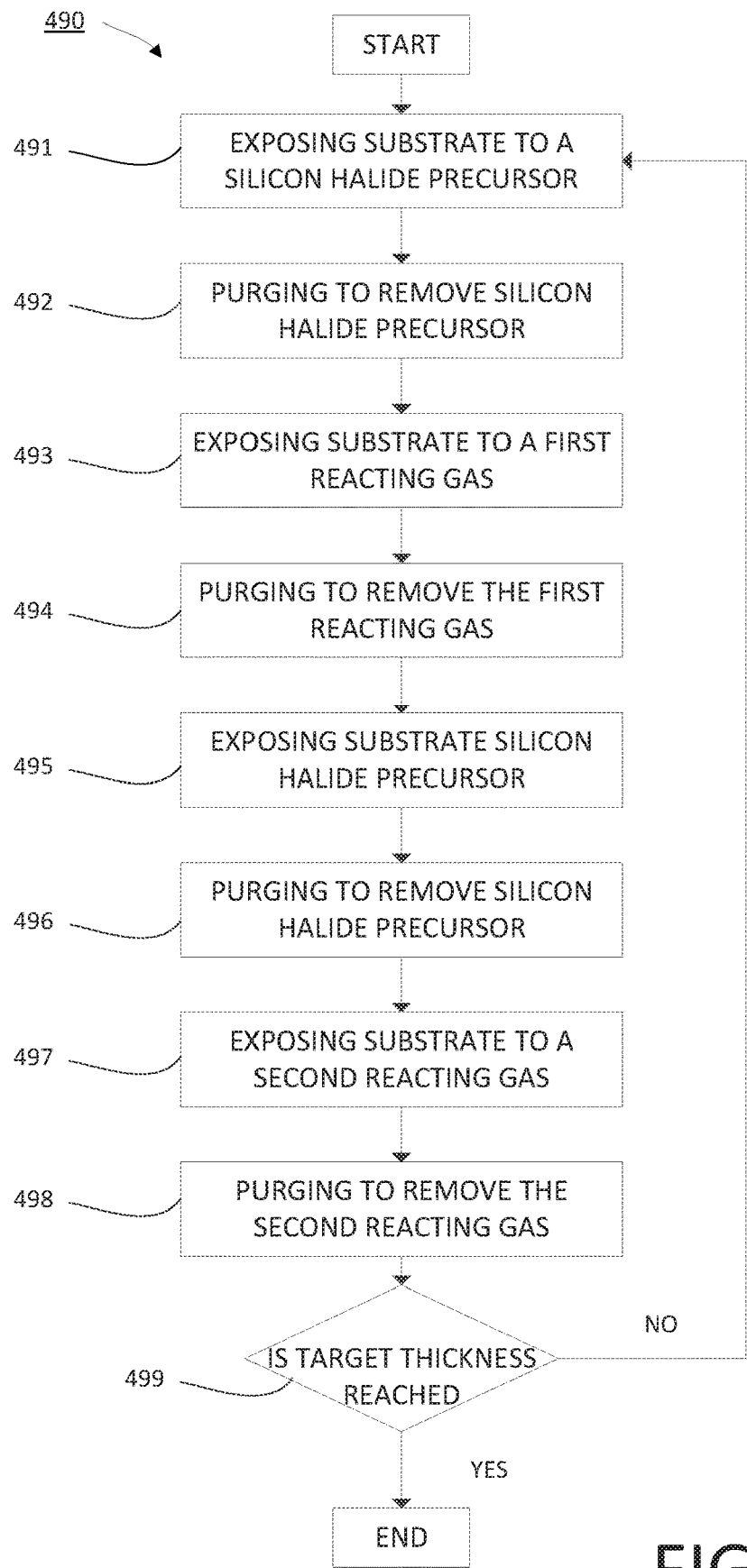
FIG. 4A is a process flow diagram of the injectors used in a third SiN deposition process that uses an ABAC ALD sequence, in accordance with an embodiment.

Referring now to FIG. 4A, a process flow diagram illustrating an ALD process 490 for forming a SiN film is shown, according to an embodiment. Process 490 describes a process that may be referred to as an "ABAC" process. An ABAC process is a process that includes sequentially exposing a substrate to four different processing operations that occur over four different injectors. Particularly, process 490 includes a first "A" injector that introduces a silicon halide precursor into the chamber through a gas/plasma port 102, a "B" injector that introduces a first reacting gas into the chamber through a gas/plasma port 102, a second "A" injector that introduces a second silicon halide precursor into the chamber through a gas/plasma port 102, and a "C" injector that introduces a second reacting gas into the chamber through a gas/plasma port 102. A schematic of the ABAC injector layout is illustrated in FIG. 4B.

Figure 4B:
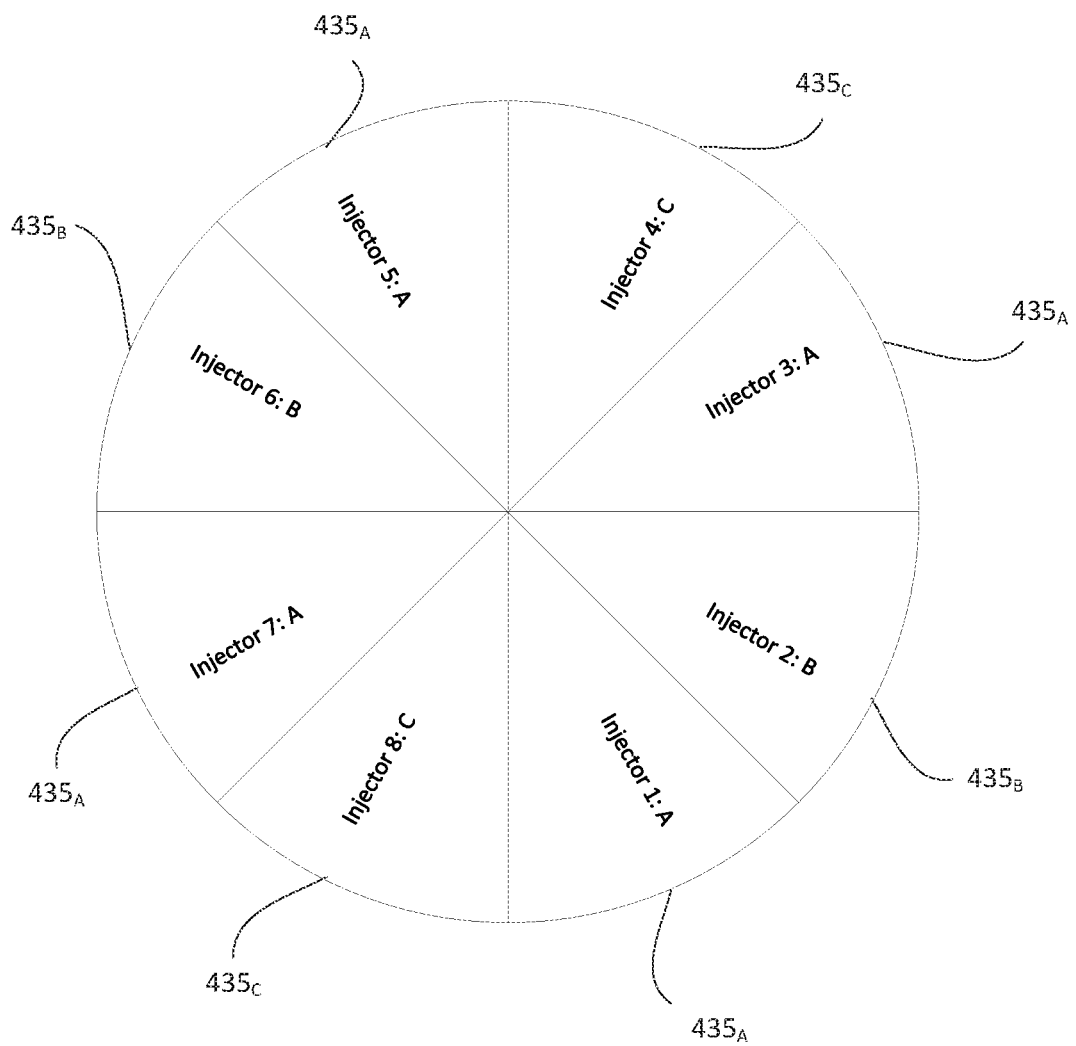
FIG. 4B is a schematic of the injectors used in the third SiN deposition process, in accordance with an embodiment.

Referring now to FIG. 4B, four injectors 435 (i.e., injectors 1, 3, 5, and 7) are the "A" injectors $435_A$ (i.e., the silicon halide precursor), two of the injectors 435 (i.e., injectors 2 and 6) are the "B" injectors $435_B$ (i.e., the first reacting gas), and two of the injectors 435 (i.e., injectors 4 and 8) are the "C" injectors $435_C$ (i.e., the second reacting gas). Each injector may correspond to a gas/plasma port 102, similar to those described above with respect to FIG. 1B. For example, each of the injectors 435 may be formed on different segments 152 of a gas/plasma distribution assembly 150 or each injector 435 may be formed on a single gas/plasma distribution assembly 150 that includes a plurality of injectors 435.

Embodiments may include a chamber that includes four injectors 435 (to accommodate the ABAC process) or any multiple of four injectors 435 (e.g., four, eight, twelve, etc.) to accommodate multiple cycles of the ABAC process in a single revolution. According to an embodiment where eight injectors 435 are used, each time a substrate makes a complete revolution around the chamber (i.e., the substrate passes below all eight injectors 435), the substrate is exposed to two ABAC ALD cycles. Since each ABAC cycle results in two growth cycles, a full revolution results in a total of four cycles. Additional embodiments may include any number of injectors 435, and therefore, may allow for any number of ABAC ALD cycles per revolution.

Referring back to ALD process 490 in FIG. 4A, the process may start with operation 491 that includes exposing a substrate to a silicon halide precursor. In an embodiment, the substrate may be initially located under any of the "A" injectors $435_A$. Embodiments include silicon halide precursors with a chemical makeup of $SiH_yX_{(4-y)}$, where X can be one of Cl, Br, and I. In a particular embodiment, the silicon halide precursor may be $SiH_xCl_{4-x}$, where x can be 0, 1, 2, 3, or 4. For example, the silicon halide precursor may be $SiH_2Cl_2$. In an embodiment, the silicon halide precursor may interact with the surface of the substrate 160 to provide a surface that is silicon rich and able to favorably react with subsequent reacting gasses in the ALD cycle to form a SiN film.

After operation 491, ALD process 490 continues on to operation 492 that includes purging to remove the silicon halide precursor. In an embodiment, the purging may be implemented by supplying an inert purging gas (e.g., $N_2$, Ar, He, etc.) through a purging port 104 and evacuating gases with a vacuum port 106. Operation 492 may be implemented as the substrate 160 is transferred to a subsequent "B" injector $435_B$. For example, a substrate 160 on a rotating susceptor assembly 130 that is positioned below injector 1 may be transferred to be below injector 2.

After operation 492, ALD process 490 continues on to operation 493 that includes exposing the substrate 160 to a first reacting gas. The substrate may be exposed to the first reacting gas while positioned below a "B" injector $435_B$. The first reacting gas reacts with the surface of the substrate 160 that has been previously exposed to the silicon halide precursor to produce a SiN film. In an embodiment, the first reacting gas comprises a hydrogen-containing gas and one or more of Ar, He, and $N_2$. The hydrogen-containing gas includes at least one of the following gases, $H_2$ (molecular hydrogen), $NH_3$ (ammonia), $N_2H_2$ (diazene), $N_2H_4$ (hydrazine), and $HN_3$ (hydrogen azide).

In an embodiment, the first reacting gas may be activated using a microwave plasma. Embodiments include a microwave plasma at a frequency of approximately 2.45 GHz. In an embodiment, the plasma power delivered to the first reacting gas is 500 W or greater for a 300 mm wafer.

Each of the constituents of the first reacting gas may provide different beneficial properties to the SiN film. For example, Ar and He increase the plasma density and increase the plasma substrate coverage. This provides improvement in the non-uniformity of the film. $N_2$ dissociates into $N^*$ radicals in a microwave plasma. The $N^*$ radicals aid in the removal of H from the SiN film and help improve the density of the SiN film. Removal of H and increased density result in a lower wet etch rate of the SiN film in diluted HF solution. The hydrogen-containing gas in the microwave dissociates into $H^*$ radicals and $NH^*/NH_2^*$ radicals. The $H^*$ radicals aid in the removal of Cl in the reaction. The $H^*$ radicals in the microwave plasma also react with $N^*$ radicals to form $NH^*/NH_2^*$ radicals. $NH^*/NH_2^*$ radicals absorb on the substrate surface and provide absorbing sites where the silicon halide precursor reacts in a subsequent ALD cycle. Accordingly, the presence of hydrogen-containing gas in microwave plasma results in improved growth per cycle (GPC) and improved throughput. In the AB process, the relative concentration of $N^*$ radicals and $NH^*/NH_2^*$ radicals is critical for the quality of the SiN film. To achieve SiN films with a high film density and a low wet etch rate, a microwave plasma with high concentration of $N^*$ radicals and low concentration of $NH^*/NH_2^*$ radicals is required. The control of the concentration of $N^*$ radicals and $NH^*/NH_2^*$ radicals is achieved by controlling the gas composition in the microwave plasma. In a particular embodiment, the flow rate of the hydrogen-containing gas is 2% or less of the total flow rate of the first reacting gas.

After operation 493, ALD process 490 continues to operation 494 that includes purging to remove the first reacting gas. In an embodiment, the purging may be implemented by supplying an inert purging gas (e.g., $N_2$, Ar, He, etc.) through a purging port 104 and evacuating gases with a vacuum port 106. Operation 494 may be implemented as the substrate 160 is transferred to a subsequent "A" injector $435_A$. For example, a substrate 160 on a rotating susceptor assembly 130 that is positioned below injector 2 may be transferred to be below injector 3.

After operation 494, ALD process 490 continues to operation 495 that includes exposing the substrate to a second silicon halide precursor. The substrate may be exposed to the second silicon halide precursor while positioned below an "A" injector $435_A$. The second silicon halide precursor may be the same silicon halide precursor as the first silicon halide precursor. In an additional embodiment, the second silicon halide precursor may be different than the first silicon halide precursor.

After operation 495, ALD process 490 continues on to operation 496 that includes purging to remove the second silicon halide precursor. In an embodiment, the purging may be implemented by supplying an inert purging gas (e.g., $N_2$, Ar, He, etc.) through a purging port 104 and evacuating gases with a vacuum port 106. Operation 492 may be implemented as the substrate 160 is transferred to a subsequent "C" injector $435_C$. For example, a substrate 160 on a rotating susceptor assembly 130 that is positioned below injector 3 may be transferred to be below injector 4.

After operation 496, ALD process 490 continues on to operation 497 that includes exposing the substrate 160 to a second reacting gas. The substrate may be exposed to the second reacting gas while positioned below a "C" injector $435c$. The second reacting gas reacts with the surface of the substrate 160 that has been previously exposed to the second silicon halide precursor to produce a SiN film. In an embodiment, the second reacting gas comprises $N_2$ and one or both of Ar and He.

In an embodiment, the second reacting gas may be activated using a microwave plasma. Embodiments include a microwave plasma at a frequency of about 2.4 5 GHz. In an embodiment, the plasma power delivered to the second reacting gas is 500 W or greater for a 300 mm wafer.

Each of the constituents of the first reacting gas may provide different beneficial properties to the SiN film. For example, Ar and He increase the plasma density and increase the plasma substrate coverage. This provides improvement in the non-uniformity of film. $N_2$ dissociates into $N^*$ radicals in a microwave plasma. The $N^*$ radicals aid in the removal of H from the SiN film and help improve the density of the SiN film. According to an embodiment, the second portion of the ABAC ALD cycle (i.e., the "AC" cycle) has a lower GPC than the first portion of the ABAC ALD cycle (i.e., the "AB" cycle). However, the AC cycle provides a denser film due to the $N^*$ radicals stripping away H from the film. As such, the AC cycle provides a lower wet etch rate. Furthermore, the plasma from the second reacting gas also treats the film formed during the AB cycles, and therefore, improves film quality.

After operation 497, ALD process 490 continues to operation 498 that includes purging to remove the second reacting gas. In an embodiment, the purging may be implemented by supplying an inert purging gas (e.g., $N_2$, Ar, He, etc.) through a purging port 104 and evacuating gases with a vacuum port 106. Operation 498 may be implemented as the substrate 160 is transferred to a subsequent A injector $435_A$. For example, a substrate 160 on a rotating susceptor assembly 130 that is positioned below injector 4 may be transferred to be below injector 5.

After operation 498, ALD process 490 continues to operation 499 that includes determining if a target thickness of the SiN film has been reached. When the target thickness has been reached, the process 490 may be ended. When the target thickness has not been reached process 490 may be repeated for another ABAC cycle (e.g., processing operations 491-499). In an embodiment, subsequent ABAC cycles may include the same processing conditions (e.g., temperatures, gas flow rates, etc). In additional embodiments, subsequent ABAC cycles may include different processing conditions. For example, the flow rates of the constituent gasses in the first reacting gas and second reacting gas may be varied in each ABAC cycle. In a particular embodiment, the flow rate of the hydrogen-containing gas in the first reacting gas may alternate between 0% of the total flow rate of the first reacting gas and 2% of the total flow rate of the first reacting gas in subsequent ABAC cycles.

It is to be appreciated that in some embodiments the substrate 160 is continually rotated on the susceptor assembly 130. As such, some embodiments may include a substrate 160 that is exposed to the A process and the B process at the same time, exposed to the B process and the C process at the same time, and exposed to the C process and the A process at the same time. Additionally, it is to be appreciated that embodiments may also include a susceptor assembly 130 that allows for the temperature of the substrate 160 to be controlled. In accordance with various embodiments, the temperature of the substrate may be less than 800° C., less than 400° C., or less than 250° C. The pressure in the processing chamber may also be controlled in order to provide desired film characteristics and/or GPC. Embodiments include processing pressures that are is 20 Torr or less, 10 Torr or less, 5 Torr or less, or 3 Torr or less.

According to an embodiment, injector 4 may be a dedicated purging injector $435_P$. Instead of supplying a processing gas (i.e., silicon halide precursor, first reacting gas, or second reacting gas), the purging injector $435_P$ may provide a segment dedicated to purging. In the illustrated embodiment, the purging injector $435_P$ is located at injector 4. However, embodiments include purging injectors $435_P$ that are located at any position (e.g., between "A" injector $435_A$ and "B" injector $435_B$, between "B" injector $435_B$ and "C" injector $435_C$, or between "C" injector $435_C$ and "A" injector $435_A$).

SiN films formed in accordance with processes 490 described above are high quality SiN films. For example, SiN films formed in accordance with embodiments of process 490 may have refractive indexes that are 1.96 or higher, and have wet etch rates in 100:1 diluted HF solution that are is 7 Å/minute or less at substrate temperature of 350° C.

Figure 5A:
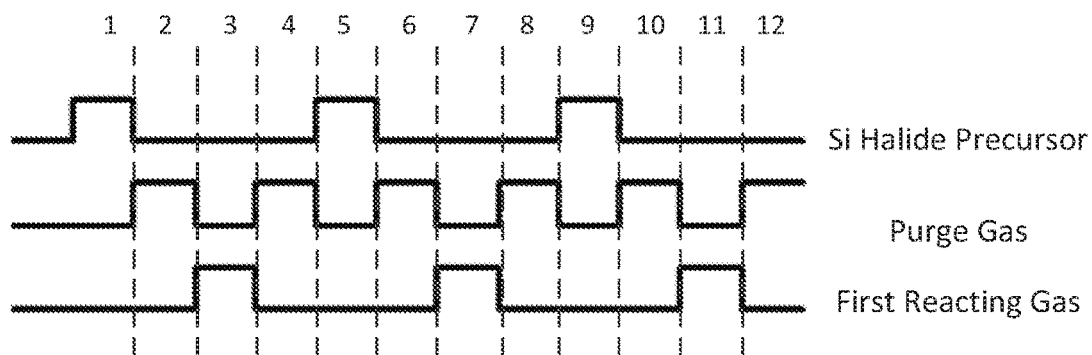
FIG. 5A is a schematic diagram of a time-based AB ALD sequence, in accordance with an embodiment.
Figure 5B:
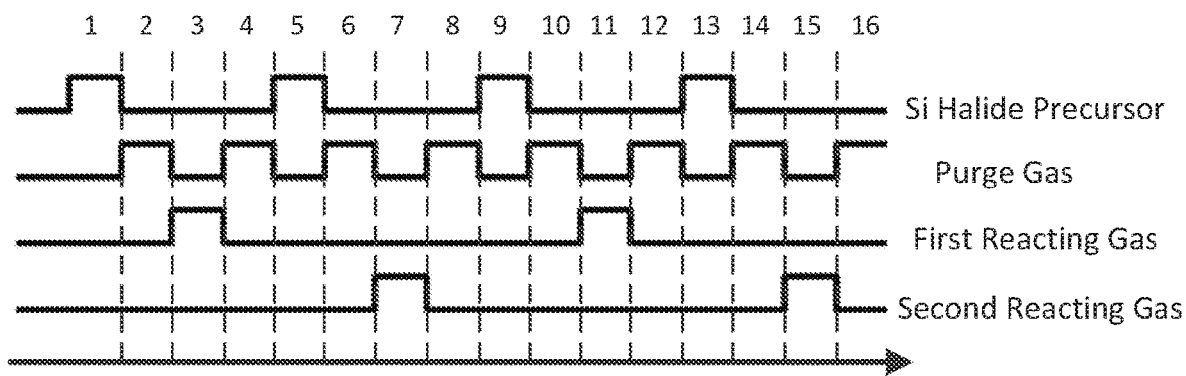
FIG. 5B is a schematic diagram of a time-based ABAC ALD sequence, in accordance with an embodiment.
Figure 5C:
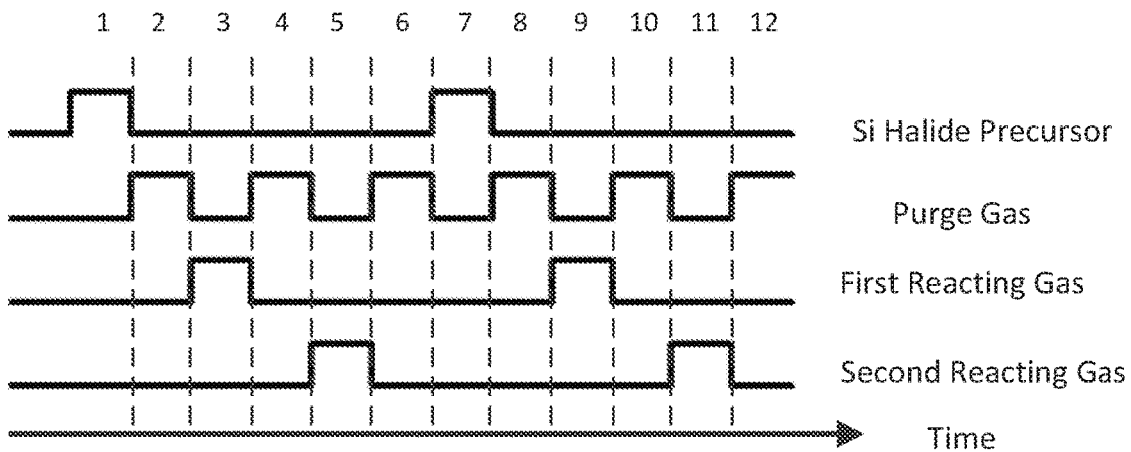
FIG. 5C is a schematic diagram of a time-based ABC ALD sequence, in accordance with an embodiment.

In the embodiments described above, the methods for depositing a SiN film are described with respect to a batch processing chamber that includes a plurality of injectors for introducing different precursor and reacting gases into the chamber. However, it is to be appreciated that embodiments may also include a single injector that introduces more than one processing gas, purge gas, or precursor gas into the chamber. Such a process may be referred to as a time based process. FIGS. 5A-5C provide a schematic illustration of such processes. In FIGS. 5A-5C, each gas is shown on a different line. The x-direction is time, as indicated by the arrow at the bottom. The time duration is broken into periods, as indicated by the dashed vertical lines. In FIGS. 5A-5C the periods are shown as being substantially equal in duration. However, it is to be appreciated that embodiments include periods that do not have equal durations. Additionally, each gas line illustrates binary states (i.e., each gas is indicated as being on or off). Accordingly, the flow rate of each gas may be different than other gasses.

Referring now to FIG. 5A, a time based AB process is illustrated. The processing gasses, the constituents of the processing gasses, and the plasma (or lack of plasma) may be substantially similar to the processes described above with respect to process 270 described above with respect to FIG. 2A. In FIG. 5A, the process may start at period 1, where the silicon halide precursor (i.e., the A processing gas) is introduced into the chamber. After period 1, the flow of the silicon halide precursor may be stopped and a purge gas may be introduced into the chamber during period 2. After period 2, the flow of the purge gas may be stopped and a first reacting gas (i.e., the B processing gas) may be introduced into the chamber during period 3. After period 3, the flow of the first reacting gas may be stopped and the purge gas may be introduced into the chamber during period 4. After period 4, an AB cycle has been completed. In an embodiment, the process may continue any number of cycles. For example, FIG. 5A illustrates three cycles that occur during periods 1-12.

Referring now to FIG. 5B, a time based ABAC process is illustrated. The processing gasses, the constituents of the processing gasses, and the plasma (or lack of plasma) may be substantially similar to the processes described above with respect to process 490 described above with respect to FIG. 4A. In FIG. 5B, the process may start at period 1, where the silicon halide precursor (i.e., the A processing gas) is introduced into the chamber. After period 1, the flow of the silicon halide precursor may be stopped and a purge gas may be introduced into the chamber during period 2. After period 2, the flow of the purge gas may be stopped and a first reacting gas (i.e., the B processing gas) may be introduced into the chamber during period 3. After period 3, the flow of the first reacting gas may be stopped and the purge gas may be introduced into the chamber during period 4. After period 4, the flow of the purge gas may be stopped and the silicon halide precursor (A gas) may be introduced into the chamber during period 5. After period 5 the flow of the silicon halide precursor may be stopped and a purge gas may be introduced into the chamber during period 6. After period 6, the flow of the purge gas may be stopped and a second reacting gas (i.e., the C processing gas) may be introduced into the chamber at period 7. After period 7, the flow of the second reacting gas may be stopped and a purge gas may be introduced into the chamber at period 8. After period 8, an ABAC cycle has been completed. In an embodiment, the process may continue any number of cycles. For example, FIG. 5B illustrates two cycles that occur during periods 1-16.

Referring now to FIG. 5C, a time based ABC process is illustrated. The processing gasses, the constituents of the processing gasses, and the plasma (or lack of plasma) may be substantially similar to the processes described above with respect to process 380 described above with respect to FIG. 3A. In FIG. 5C, the process may start at period 1, where the silicon halide precursor (i.e., the A processing gas) is introduced into the chamber. After period 1, the flow of the silicon halide precursor may be stopped and a purge gas may be introduced into the chamber during period 2. After period 2, the flow of the purge gas may be stopped and a first reacting gas (i.e., the B processing gas) may be introduced into the chamber during period 3. After period 3, the flow of the first reacting gas may be stopped and the purge gas may be introduced into the chamber during period 4. After period 4, the flow of the purge gas may be stopped and a second reacting gas (i.e., the C processing gas) may be introduced into the chamber at period 5. After period 5, the flow of the second reacting gas may be stopped and a purge gas may be introduced into the chamber at period 6. After period 6, an ABC cycle has been completed. In an embodiment, the process may continue any number of cycles. For example, FIG. 5C illustrates two cycles that occur during periods 1-12.

It is to be appreciated that embodiments described herein may also include processes for forming silicon nitride layers that include a hybrid process including both time-based exposures (similar to those described with respect to FIGS. 5A-5C) and movement based exposures (similar to those described with respect to FIGS. 2A-4B).

Figure 6:
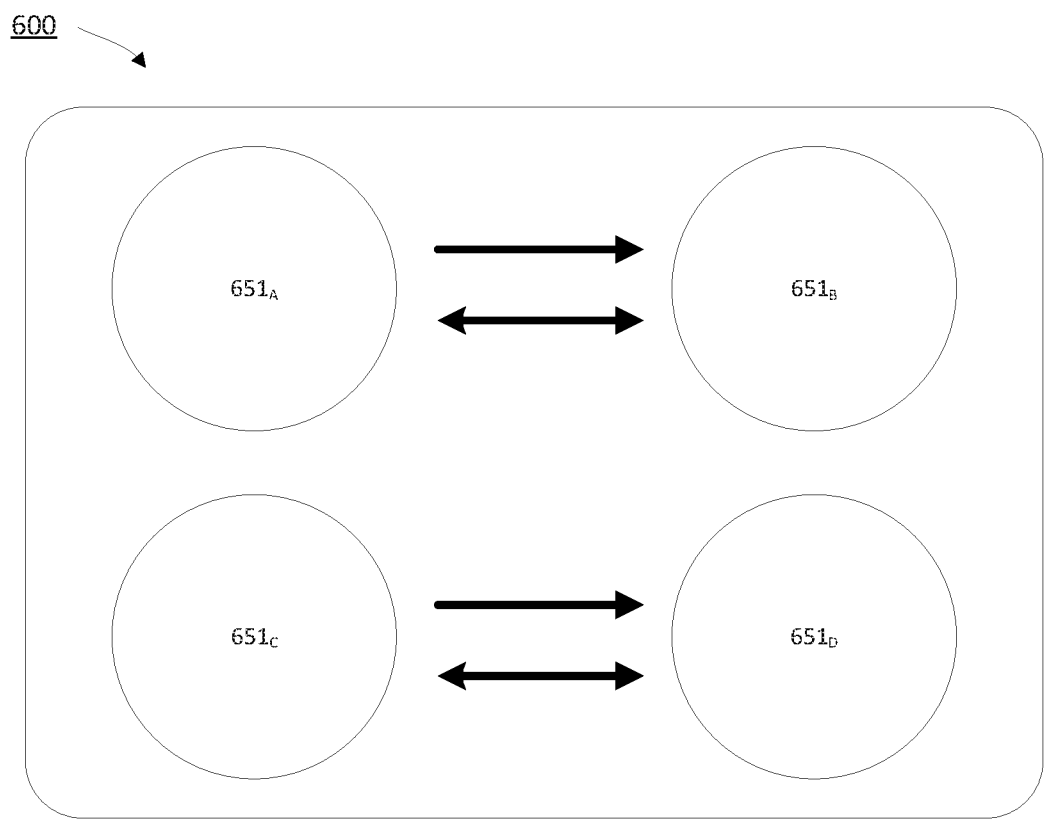
FIG. 6 is a schematic diagram of a processing chamber that is used to initiate a time-based and movement based ABC ALD sequence, in accordance with an embodiment.

Referring now to FIG. 6, a schematic diagram of a deposition chamber that may be used for such hybrid processes is shown, in accordance with an embodiment. Deposition chamber 600 may include a plurality positions $651_A$ $651_B$ $651_C$ and $651_D$ within the chamber. While four positions are shown, it is to be appreciated that two or more positions may be used in accordance with embodiments described herein. Each position 651 may be located under an injector similar to those described above.

According to an embodiment, the plurality of positions 651 may be designated as a silicon halide precursor position or a reacting gas position. For example, positions $651_A$ and $651_C$ may be precursor positions, and positions $651_B$ and $651_D$ may be reacting gas positions. In an embodiment, the reacting gas positions $651_B$ and $651_D$ may be able to inject more than one type of reacting gas into the chamber 600. For example, in an ABC ALD process, a substrate may be positioned initially at a first position $651_A$ and exposed to a silicon halide precursor (i.e., the A process). Thereafter, the substrate may be moved (as indicated by the arrow) to a second position $651_B$ and exposed to the first and second reacting gasses (i.e., the B and C processes). In an embodiment the first and second reacting gasses are a time-based sequence similar to those described above. After the time-based exposures, the process may be repeated by moving the substrate back to the first position (as indicated by the arrow).

Figure 7:
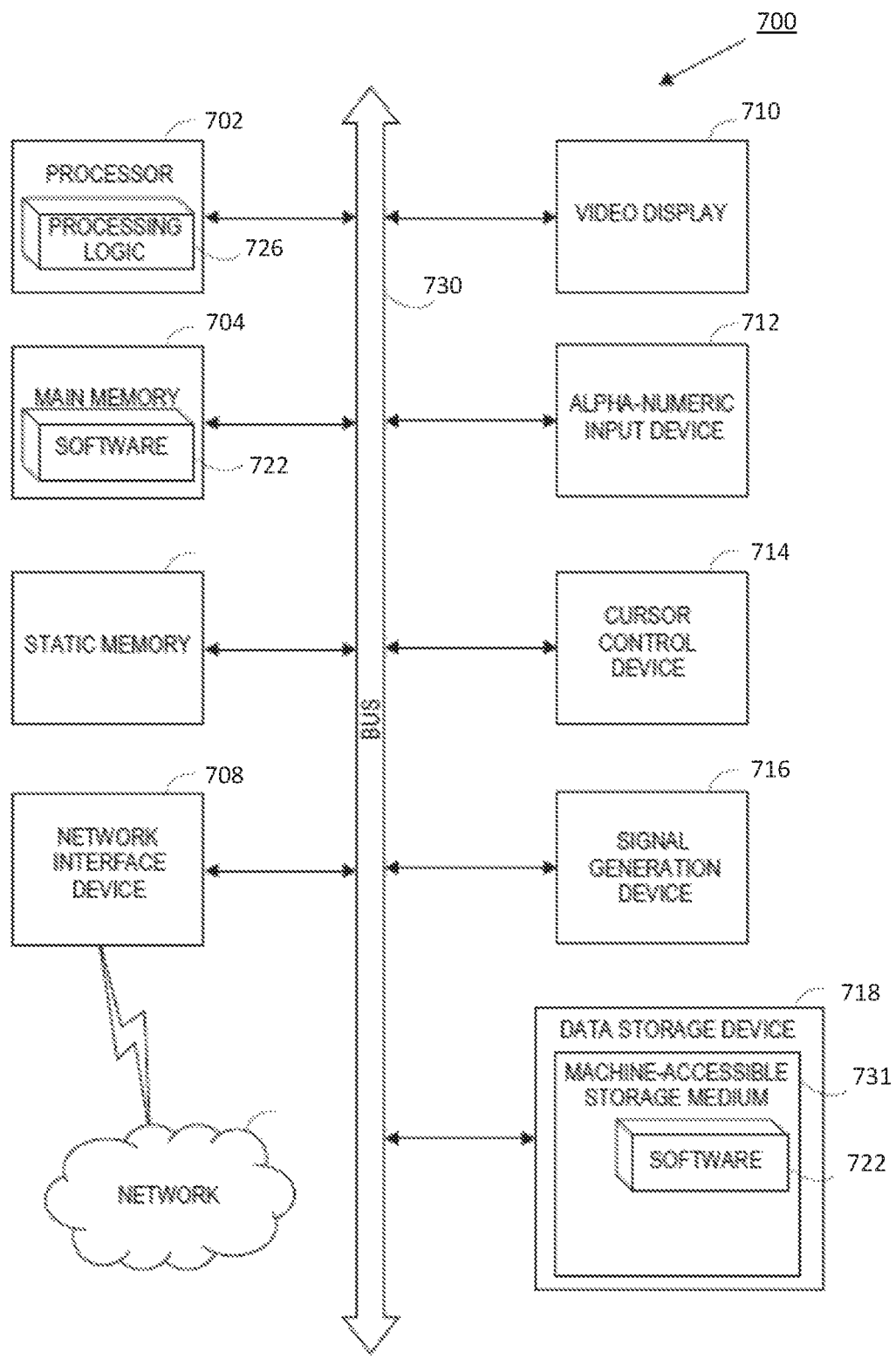
FIG. 7 illustrates a block diagram of an exemplary computer system that may be used in conjunction with processes that include depositing SiN films, in accordance with an embodiment.

Referring now to FIG. 7, a block diagram of an exemplary computer system 760 of a processing tool is illustrated in accordance with an embodiment. In an embodiment, computer system 760 is coupled to and controls processing in the processing tool. Computer system 760 may be connected (e.g., networked) to other machines in a Local Area Network (LAN), an intranet, an extranet, or the Internet. Computer system 760 may operate in the capacity of a server or a client machine in a client-server network environment, or as a peer machine in a peer-to-peer (or distributed) network environment. Computer system 760 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 760, the term "machine" shall also be taken to include any collection of machines (e.g., computers) that individually or jointly execute a set (or multiple sets) of instructions to perform any one or more of the methodologies described herein.

Computer system 760 may include a computer program product, or software 722, having a non-transitory machine-readable medium having stored thereon instructions, which may be used to program computer system 760 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 760 includes a system processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

System processor 702 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 702 may also be one or more special-purpose processing devices such as an application specific integrated circuit (ASIC), a field programmable gate array (FPGA), a digital signal system processor (DSP), network system processor, or the like. System processor 702 is configured to execute the processing logic 726 for performing the operations described herein.

The computer system 760 may further include a system network interface device 708 for communicating with other devices or machines. The computer system 760 may also include a video display unit 710 (e.g., a liquid crystal display (LCD), a light emitting diode display (LED), or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium 731 (or more specifically a computer-readable storage medium) on which is stored one or more sets of instructions (e.g., software 722) embodying any one or more of the methodologies or functions described herein. The software 722 may also reside, completely or at least partially, within the main memory 704 and/or within the system processor 702 during execution thereof by the computer system 760, the main memory 704 and the system processor 702 also constituting machine-readable storage media. The software 722 may further be transmitted or received over a network 720 via the system network interface device 708.

While the machine-accessible storage medium 731 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A method for forming a silicon nitride film on a substrate in a deposition chamber, wherein the substrate is sequentially exposed to a sequence of processing gases, comprising:
    (a) a silicon halide precursor, wherein the silicon halide absorbs onto a surface of the substrate to form an absorbed layer of the silicon halide, and wherein the silicon halide precursor comprises $SiH_YX_{4-Y}$, wherein Y is one of 1, 3 or 4, and wherein X is Cl;
    (b) an inert purge gas comprising a gas selected from the group consisting nitrogen gas, argon gas and helium gas;
    (c) a first reacting gas comprising $N_2$ and one or both of Ar and He, wherein the first reacting gas is activated using a plasma source; and (d) a second reacting gas comprising a hydrogen-containing gas and $N_2$, wherein the hydrogen-containing gas includes $HN_3$ (hydrogen azide), wherein the substrate is sequentially exposed to the first reacting gas and then to the second reacting gas without being exposed to an intervening reacting gas; and repeating the sequence (a) to (d) until a desired thickness of the silicon nitride film is obtained.

2. The method of claim 1, wherein the deposition chamber pressure is 20 Torr or less.

3. The method of claim 1, wherein the substrate temperature is 800 C or less.

4. The method of claim 1, wherein the first reacting gas and second reacting gas are activated by a microwave plasma.

5. The method of claim 4, wherein a plasma power delivered to the first reacting gas and second reacting gas is equal to or greater than 500 W.

6. The method of claim 1, wherein the flow rate of the hydrogen-containing gas in the second reacting gas is equal to or greater than 5% of the total gas flow rate.

7. The method of claim 1, wherein the sequential exposure of the substrate to the silicon halide precursor, the first reacting gas, and the second reacting gas is achieved by moving the substrate through the sequence of exposures in a deposition chamber.

8. The method of claim 1, wherein the sequential exposure of the substrate to the silicon halide precursor, the first reacting gas, and the second reacting gas is achieved by a time-based sequence of exposures in a deposition chamber.

9. The method of claim 1, wherein the substrate is exposed to the silicon halide precursor in a first location of the deposition chamber, and wherein the substrate is exposed to the first reacting gas and the second reacting gas in a second location of the deposition chamber.

10. A method for forming a silicon nitride film on a substrate in a deposition chamber, wherein the substrate is sequentially exposed to a sequence of processing gases comprising:

(a) a first silicon halide precursor, wherein the silicon halide absorbs onto a surface of the substrate to form an absorbed layer of the silicon halide;

(b) an inert purge gas comprising a gas selected from the group consisting nitrogen gas, argon gas and helium gas;

(c) a first reacting gas comprising $N_2$ and a hydrogen-containing gas and one or both of Ar and He, wherein the hydrogen-containing gas includes $HN_3$ (hydrogen azide), wherein the first reacting gas is activated using a plasma source; and (d) a second silicon halide precursor, wherein the silicon halide absorbs onto a growth surface of the substrate to form an absorbed layer of the silicon halide, and wherein the first and second silicon halide precursor comprises $SiH_yX_{4-y}$, wherein Y is one of 1, 3 or 4, and wherein X is Cl; and (e) a second reacting gas comprising $N_2$ and one or both of Ar and He, wherein the second reacting gas is activated using a plasma source, wherein the substrate is sequentially exposed to the first reacting gas and then to the second reacting gas without being exposed to an intervening reacting gas; and repeating the sequence (a) to (e) until a desired thickness of the silicon nitride film is obtained.

11. The method of claim 10, wherein the deposition chamber pressure is 20 Torr or less.

12. The method of claim 10, wherein the substrate temperature is 800° C. or less.

13. The method of claim 10, wherein the first reacting gas and second reacting gas are activated by a microwave plasma.

14. The method of claim 13, wherein a plasma power delivered to the first reacting gas and second reacting gas is equal to or greater than 500 W.

15. The method of claim 10, wherein the flow rate of the hydrogen-containing gas in the first reacting gas is 2% or less of the total gas flow rate, and wherein the flow rate of $N_2$ gas in the first reacting gas is 2% or greater of the total gas flow rate.

16. The method of claim 15, wherein the flow rate of $N_2$ gas is 5 times higher than the flow rate of the hydrogen-containing gas.

17. The method of claim 10, wherein the sequential exposure of the substrate to the first silicon halide precursor, the first reacting gas, the second silicon halide precursor, and the second reacting gas is achieved by moving the substrate through the sequence of exposures in a deposition chamber.

18. The method of claim 10, wherein the sequential exposure of the substrate to the first silicon halide precursor, the first reacting gas, the second silicon halide precursor, and the second reacting gas is achieved by a time-based sequence of exposures in a deposition chamber.

* * * * *